(12) United States Patent
Xu et al.

(10) Patent No.: US 6,514,390 B1
(45) Date of Patent: Feb. 4, 2003

(54) METHOD TO ELIMINATE COIL SPUTTERING IN AN ICP SOURCE

(75) Inventors: Zheng Xu, Foster City, CA (US); Fusen Chen, Cupertino, CA (US); Jaim Nulman, Palo Alto, CA (US)

(73) Assignee: Applied Materials, Inc., Santa Clara, CA (US)

( * ) Notice: Subject to any disclaimer, the term of this patent is extended or adjusted under 35 U.S.C. 154(b) by 986 days.

(21) Appl. No.: 08/733,620

(22) Filed: Oct. 17, 1996

(51) Int. Cl.⁷ .............................................. C23C 14/35
(52) U.S. Cl. ........................... 204/192.12; 204/298.06; 204/298.08; 204/298.11; 204/298.16
(58) Field of Search ....................... 204/192.12, 298.06, 204/298.08, 298.11, 298.16

(56) References Cited

U.S. PATENT DOCUMENTS

| | | | |
|---|---|---|---|
| 4,362,632 A | 12/1982 | Jacob | 422/186.04 |
| 4,716,491 A | * 12/1987 | Ohno et al. | 361/230 |
| 4,792,732 A | 12/1988 | O'Loughlin | 315/334 |
| 4,842,703 A | 6/1989 | Class et al. | 204/192.12 |
| 4,844,775 A | 7/1989 | Keeble | 216/68 |
| 4,865,712 A | * 9/1989 | Mintz | 204/298.16 |
| 4,918,031 A | 4/1990 | Flamm et al. | 437/225 |
| 4,925,542 A | 5/1990 | Kidd | 427/531 |
| 4,948,458 A | 8/1990 | Ogle | 156/643.1 |
| 4,990,229 A | 2/1991 | Campbell et al. | 204/298.06 |
| 5,065,698 A | 11/1991 | Koike | 118/719 |

(List continued on next page.)

FOREIGN PATENT DOCUMENTS

| | | |
|---|---|---|
| EP | 0520519 | 12/1992 |
| EP | 0593924 | 9/1993 |
| GB | 2162365 | 1/1986 |
| GB | 2191787 | 4/1987 |
| GB | 2231197 | 11/1990 |
| JP | 61190070 | 8/1986 |
| JP | 6232055 | 8/1994 |
| JP | 6283470 | 10/1994 |
| JP | 7176398 | 7/1995 |
| JP | 7176399 | 7/1995 |
| JP | 8153712 | 6/1996 |
| JP | 8288259 | 11/1996 |
| WO | WO860623 | 11/1986 |
| WO | 9207969 | 5/1992 |

OTHER PUBLICATIONS

N. Jiwari et al., "Helicon wave plasma reactor employing single–loop antenna," *J. of Vac. Sci. Technol.*, A 12(4), pp. 1322–1327, Jul./Aug. 1994.

Search report dated Feb. 27, 1997, EPC application No. 96308251.6.

U.S. patent application Ser. No. 08/741,708, filed Oct. 31, 1996 (Attorney Docket # 1590/PVD/DV).

Search Report in European application No. 97308280.3 dated Jul. 31, 1998.

M. Yamashita, "Sputter Type High Frequency Ion Source for Ion Beam Deposition Apparatus," *Jap. J. Appl. Phys.*, vol. 26, pp. 721–727, 1987.

(List continued on next page.)

*Primary Examiner*—Rodney G. McDonald
(74) *Attorney, Agent, or Firm*—Konrad Raynes Victor & Mann LLP

(57) ABSTRACT

A magnetic shield to reduce sputtering of an RF coil for a plasma chamber in a semiconductor fabrication system is provided. The magnetic shield also reduces deposition of material onto the coil which in turn leads to a reduction in particulate matter shed by the coil onto the workpiece.

21 Claims, 6 Drawing Sheets

U.S. PATENT DOCUMENTS

| | | | |
|---|---|---|---|
| 5,091,049 A | 2/1992 | Campbell et al. | 216/37 |
| 5,122,251 A | 6/1992 | Campbell et al. | 204/298.06 |
| 5,135,629 A | 8/1992 | Sawada et al. | 204/192.12 |
| 5,146,137 A | 9/1992 | Gesche et al. | 315/111.21 |
| 5,175,608 A | 12/1992 | Nihei et al. | 257/751 |
| 5,178,739 A * | 1/1993 | Barnes et al. | 204/192.12 |
| 5,206,516 A | 4/1993 | Keller et al. | 250/492.2 |
| 5,225,740 A | 7/1993 | Ohkawa | 315/111.41 |
| 5,231,334 A | 7/1993 | Paranjpe | 315/111.21 |
| 5,234,560 A | 8/1993 | Kadlec et al. | 204/192.12 |
| 5,241,245 A | 8/1993 | Barnes et al. | 315/111.41 |
| 5,280,154 A | 1/1994 | Cuomo et al. | 219/121.52 |
| 5,304,279 A | 4/1994 | Coultas et al. | 156/345 |
| 5,312,717 A | 5/1994 | Sachdev et al. | 430/313 |
| 5,346,578 A | 9/1994 | Benzing et al. | 156/345 |
| 5,361,016 A | 11/1994 | Ohkawa et al. | 315/111.41 |
| 5,366,590 A | 11/1994 | Kadomura | 156/662.1 |
| 5,368,685 A | 11/1994 | Kumihashi et al. | 216/70 |
| 5,397,962 A | 3/1995 | Moslehi | 315/111.51 |
| 5,404,079 A | 4/1995 | Ohkuni et al. | 315/111.81 |
| 5,418,431 A | 5/1995 | Williamson et al. | 315/111.51 |
| 5,421,891 A | 6/1995 | Campbell et al. | 118/723 R |
| 5,429,070 A | 7/1995 | Campbell et al. | 118/723 R |
| 5,429,710 A | 7/1995 | Akiba et al. | 216/17 |
| 5,429,995 A | 7/1995 | Nishiyama et al. | 437/238 |
| 5,430,355 A | 7/1995 | Paranjpe | 315/111.21 |

OTHER PUBLICATIONS

M. Yamashita, "Fundamental Characteristics of Built–in High Frequency Coil Type Sputtering Apparatus," *J. Vac. Sci. Technol.,* vol. A7, pp. 151–158, 1989.

S.M. Rossnagel et al., "Metal Ion Deposition from Ionized Magnetron Sputtering Discharge," *J. Vac. Sci. Technol.,* vol. B12, pp. 449–453, 1994.

S.M. Rossnagel et al., "Magnetron Sputter Deposition with High Levels of Metal Ionization," *Appl. Phys. Lett.,* vol. 63, pp. 3285–3287, 1993.

S.M. Rossnagel, et al., "Filling Dual Damascene Interconnect Structures with AlCu and Cu using Ionized Magnetron Deposition," *J. Vac. Sci. Technol.,* vol. B13, pp. 125–129, 1995.

Y–W. Kim et al., "Ionized Sputter Deposition of AlCu: Film Microstructure and Chemistry," *J. Vac. Sci. Technol.,* vol. A12, pp. 3169–3175, 1994.

J. Hopwood et al., "Mechanisms for Highly Ionized Magnetron Sputtering," *J. Appl. Phys.,* vol. 78, pp. 758–765, 1995.

P. Kidd, "A Magnetically Confined and ECR Heated Plasma Machine for Coating and Ion Surface Modification Use," *J. Vac. Sci. Technol.,* vol. A9, pp. 466–473, 1991.

W.M. Holber, et al., "Copper Deposition by Electron Cyclotron Resonance Plasma," *J. Vac. Sci. Technol.,* vol. A11, pp. 2903–2910, 1993.

S.M. Rossnagel, "Directional and Ionized Sputter Deposition for Microelectronics Applications," *Proc. of 3rd ISSP (Tokyo),* pp. 253–260, 1995.

M. Matsuoka et al., Dense Plasma Production and Film Deposition by New High–Rate Sputtering Using an Electric Mirror, *J. Vac. Sci. Technol.,* A 7 (4), 2652–2657, Jul./Aug. 1989.

* cited by examiner

METHOD TO ELIMINATE COIL SPUTTERING IN AN ICP SOURCE

FIELD OF THE INVENTION

The present invention relates to plasma generators, and more particularly, to a method and apparatus for generating a plasma to sputter deposit a layer of material in the fabrication of semiconductor devices.

BACKGROUND OF THE INVENTION

Low pressure radio frequency (RF) generated plasmas have become convenient sources of energetic ions and activated atoms which can be employed in a variety of semiconductor device fabrication processes including surface treatments, depositions, and etching processes. For example, to deposit materials onto a semiconductor wafer using a sputter deposition process, a plasma is produced in the vicinity of a sputter target material which is negatively biased. Ions created within the plasma impact the surface of the target to dislodge, i.e., "sputter" material from the target. The sputtered materials are then transported and deposited on the surface of the semiconductor wafer.

Sputtered material has a tendency to travel in straight line paths, from the target to the substrate being deposited, at angles which are oblique to the surface of the substrate. As a consequence, materials deposited in etched trenches and holes of semiconductor devices having trenches or holes with a high depth to width aspect ratio, can bridge over causing undesirable cavities in the deposition layer. To prevent such cavities, the sputtered material can be redirected into substantially vertical paths between the target and the substrate by negatively charging the substrate and positioning appropriate vertically oriented electric fields adjacent the substrate if the sputtered material is sufficiently ionized by the plasma. However, material sputtered by a low density plasma often has an ionization degree of less than 1% which is usually insufficient to avoid the formation of an excessive number of cavities. Accordingly, it is desirable to increase the density of the plasma to increase the ionization rate of the sputtered material in order to decrease the formation of unwanted cavities in the deposition layer. As used herein, the term "dense plasma" is intended to refer to one that has a high electron and ion density.

There are several known techniques for exciting a plasma with RF fields including capacitive coupling, inductive coupling and wave heating. In a standard inductively coupled plasma (ICP) generator, RF current passing through a coil surrounding the plasma induces electromagnetic currents in the plasma. These currents heat the conducting plasma by ohmic heating, so that it is sustained in steady state. As shown in U.S. Pat. No. 4,362,632, for example, current through a coil is supplied by an RF generator coupled to the coil through an impedance matching network, such that the coil acts as the first windings of a transformer. The plasma acts as a single turn second winding of a transformer.

In order to maximize the energy being coupled from the coil to the plasma, it is desirable to position the coil, as close as possible to the plasma itself. At the same time, however, it is also desirable to minimize the generation of particles being shed from interior surfaces. These particles shed from interior surfaces can fall on the wafer itself and contaminate the product. Accordingly, many sputtering chambers have a generally annular-shaped shield enclosing the plasma generation area between the target and the pedestal supporting the wafer. The shield provides a smooth gently curved surface which is relatively easy to clean and protects the interior of the vacuum chamber from being deposited with the sputtering material. In contrast, it is believed that a coil and any supporting structure for the coil generally have relatively sharply curved surfaces from which it would be more difficult to clean away materials deposited from the coil and its supporting structures. In addition, it is believed that the smooth gently curved surface of the shield would tend to shed fewer particles than the sharply curved surfaces of the coil and its supporting structure.

Thus, on the one hand, it would be desirable to place the coil outside the shield (as described in application Ser. No. 08/559,345, filed Nov. 15, 1995 now U.S. Pat. No. 6,264, 812 for METHOD AND APPARATUS FOR LAUNCHING A HELICON WAVE IN A PLASMA which is assigned to the assignee of the present application and is incorporated herein by reference) so that the coil is shielded from the material being deposited. Such an arrangement would minimize generation of particles by the coil and its supporting structure and would facilitate cleaning of the chamber. On the other hand, it is desirable to place the coil as close as possible to the plasma generation area inside the shield, to avoid any attenuation by the spacing from the plasma or by the shield itself, and thereby to maximize energy transfer from the coil to the plasma. Accordingly, it has been difficult to increase energy transfer from the coil to the plasma while at the same time minimizing particle generation and facilitating chamber cleaning.

SUMMARY OF THE PREFERRED EMBODIMENTS

It is an object of the present invention to provide an improved method and apparatus for generating a plasma within a chamber and for sputter depositing a layer which obviate, for practical purposes, the above-mentioned limitations.

These and other objects and advantages are achieved by, in accordance with one aspect of the invention a plasma generating apparatus which inductively couples electromagnetic energy from a coil which is magnetically shielded from the plasma and ionized target material so as to minimize the deposition of target material onto the coil. As a consequence, contamination of the workpiece by particulate matter shed by the coil may be reduced.

In a preferred embodiment, an apparatus for energizing a plasma within a semiconductor fabrication system to sputter material onto a workpiece may include a semiconductor fabrication chamber having a plasma generation area within the chamber, a coil carried by the chamber and positioned to couple energy into the plasma generation area, and an arrangement of magnetic fields positioned to reduce sputtering from the coil onto the workpiece. Alternatively, the arrangement of magnetic fields may by positioned also to reduce sputtering from the target onto the coil. The target and coil may both include titanium, aluminum or other suitable materials. The apparatus may include one or more electromagnet coils carried by the chamber and positioned to provide the arrangement of magnetic fields. Alternatively, the apparatus may include one or more permanent magnets carried by the chamber and positioned to provide the arrangement of magnetic fields.

DETAILED DESCRIPTION OF THE DRAWINGS

Figure 1:
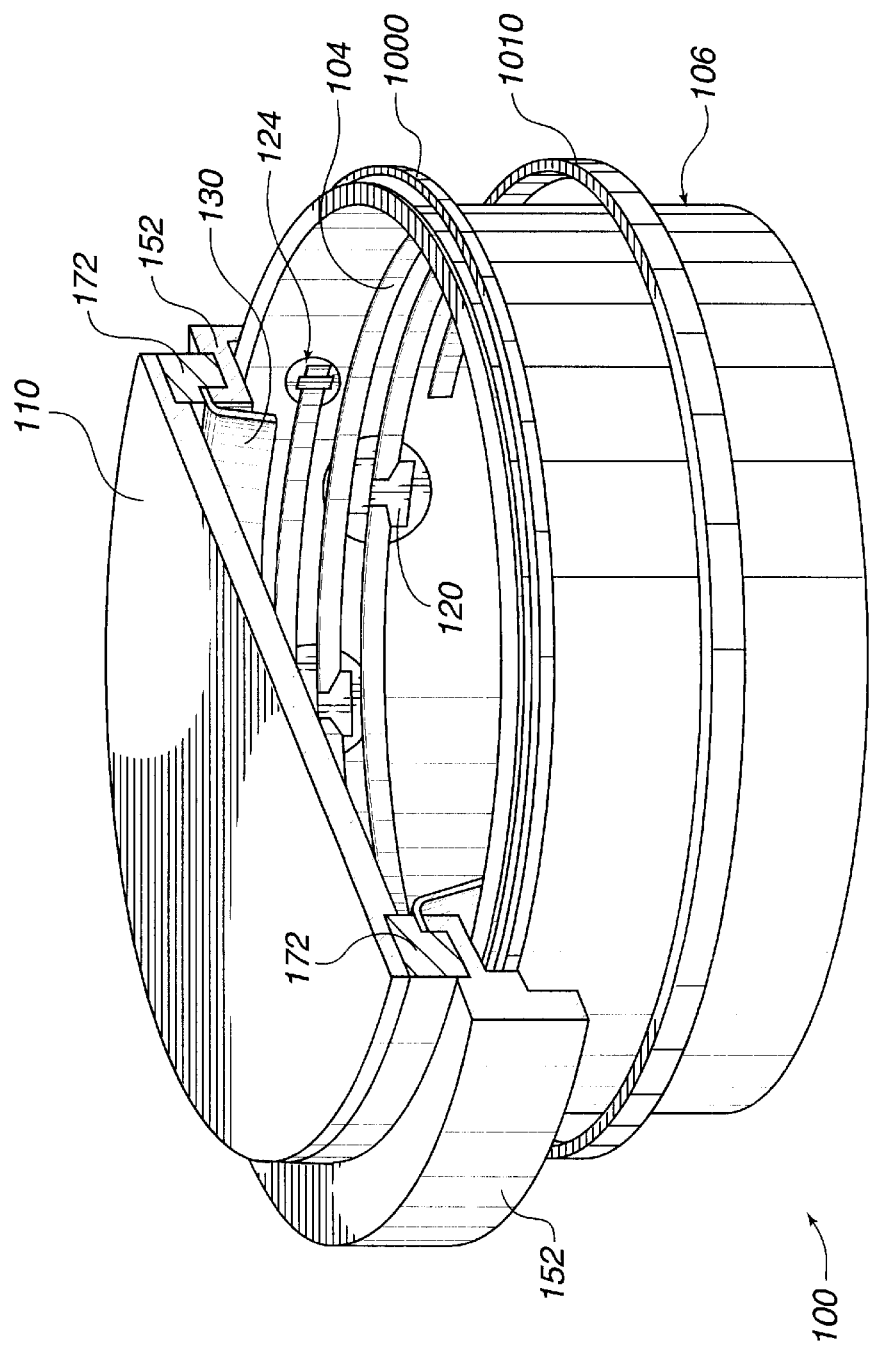
FIG. 1 is a perspective, partial cross-sectional view of a plasma generating chamber in accordance with an embodiment of the present invention.
Figure 2:
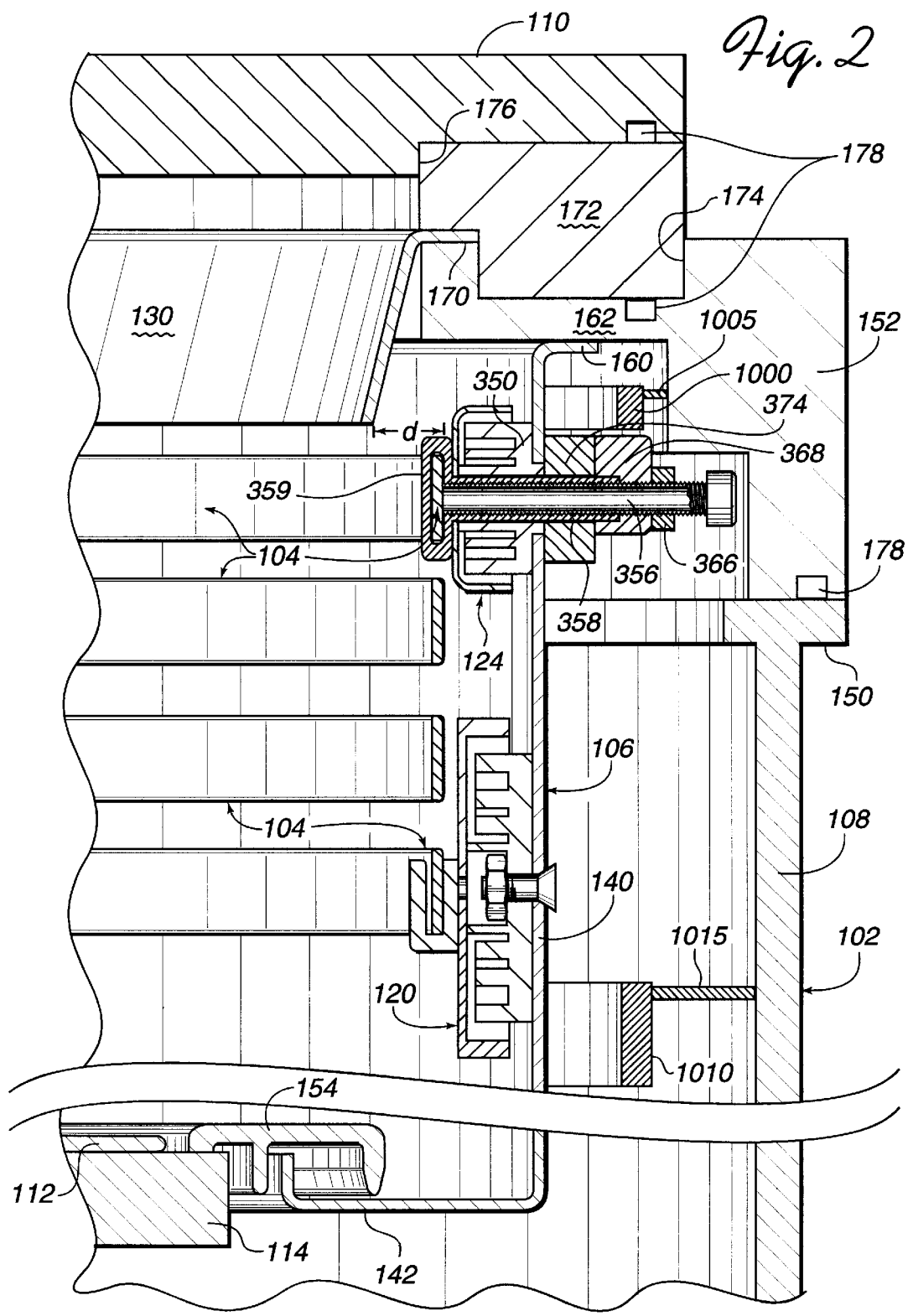
FIG. 2 is a partial cross-sectional view of the plasma generating chamber of FIG. 1 shown installed in a vacuum chamber.
Figure 3:
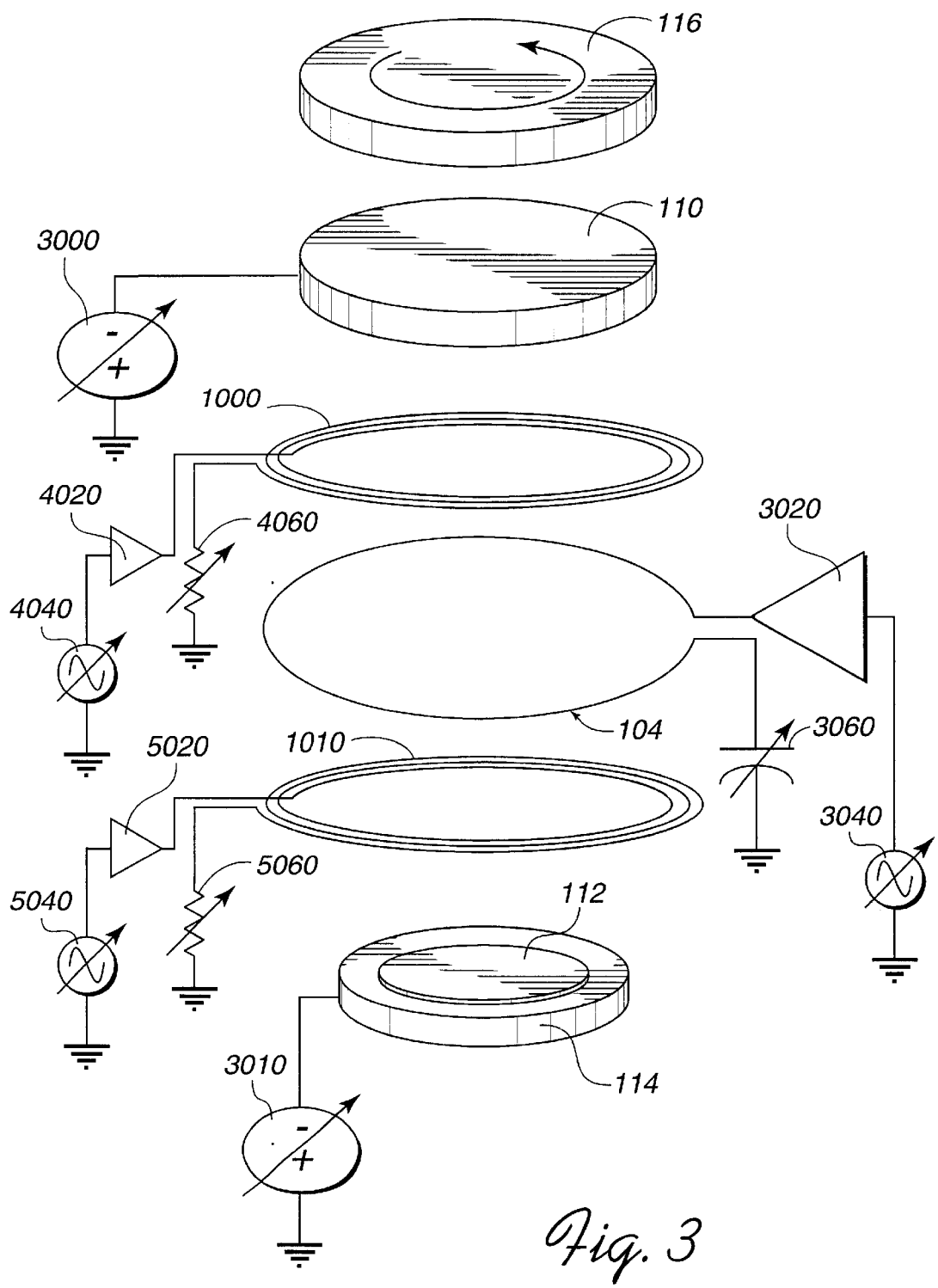
FIG. 3 is a schematic diagram of the electrical interconnections to the plasma generating chambers of FIGS. 1–2.

Referring first to FIGS. 1–3, a plasma generator in accordance with an embodiment of the present invention comprises a substantially cylindrical plasma chamber 100 which is received in a vacuum chamber 102 (FIG. 2). The plasma chamber 100 of this embodiment has a single helical coil 104 which is carried internally of the vacuum chamber walls 108 (FIG. 2) by a chamber shield 106. The chamber shield 106 protects the interior walls 108 (FIG. 2) of the vacuum chamber 102 from the material being deposited within the interior of the plasma chamber 100.

Radio frequency (RF) energy from an RF generator 3040 is radiated from the coil 104 into the interior of the plasma chamber 100, which energizes a plasma within the plasma chamber 100. An ion flux strikes a negatively biased target 110 positioned above the plasma chamber 100. The plasma ions eject material from the target 110 onto a substrate 112 which may be a wafer or other workpiece supported by a pedestal 114 at the bottom of the plasma chamber 100. A rotating magnet assembly 116 provided above the target 110 produces magnetic fields which sweep over the face of the target 110 to promote uniform erosion by sputtering of the target 110.

As will be explained in greater detail below, in accordance with one aspect of the present invention, the coil 104 is magnetically shielded by magnetic fields generated by electromagnet coils 1000 and 1010 so as to minimize sputtering of material from the coil 104. In addition, the deposition of target material onto the coil 104 may also be reduced. As a consequence, contamination of the substrate 112 by material sputtered from the coil 104 or by particulate matter shed by the coil 104 may be reduced.

Figure 4:
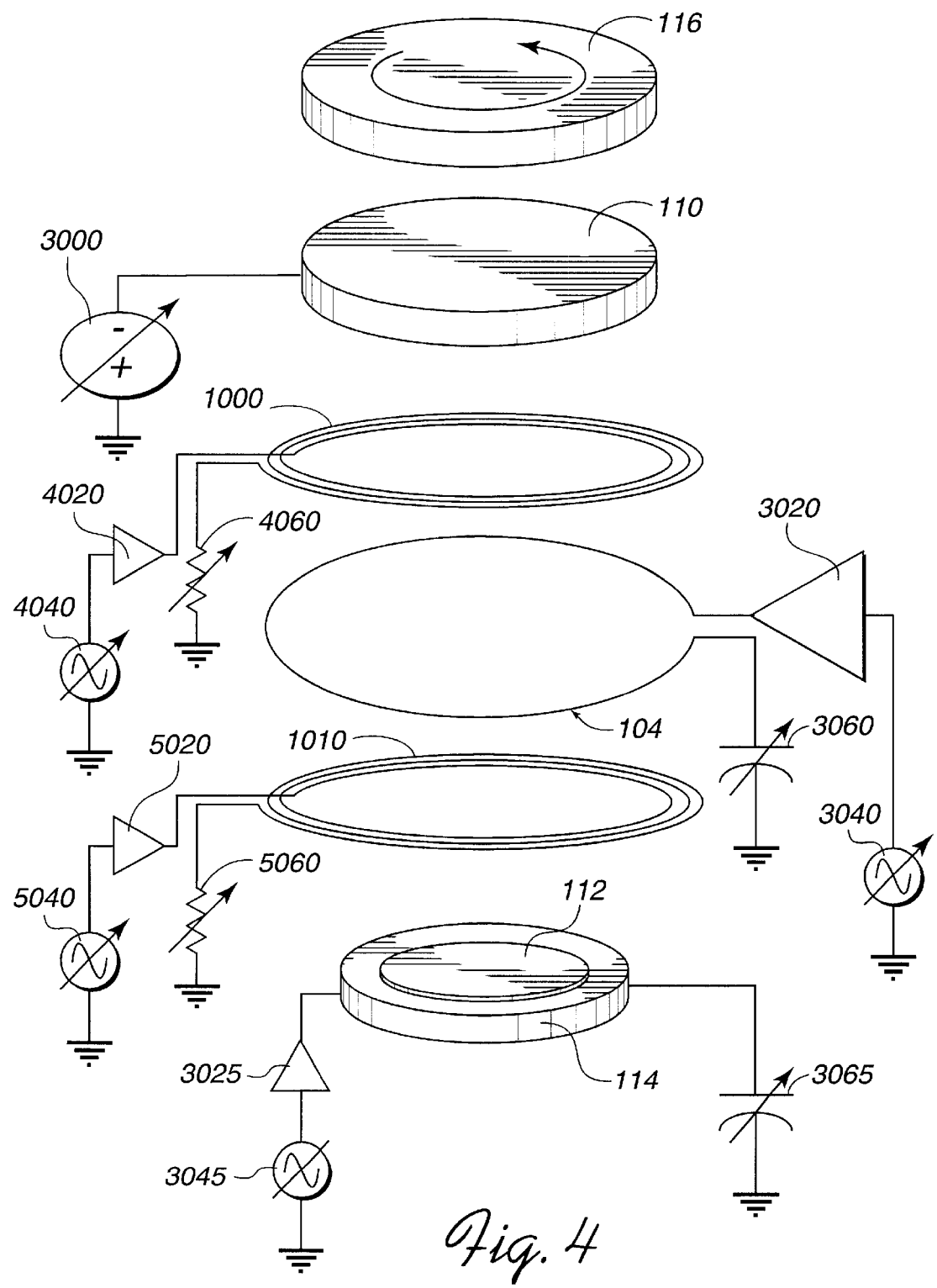
FIG. 4 is a schematic diagram of alternative electrical interconnections to the plasma generating chambers of FIGS. 1–2.

FIG. 3 is a schematic representation of the electrical connections of the plasma generating apparatus of this illustrated embodiment. To attract the ions generated by the plasma, the target 110 is preferably negatively biased by a variable DC power source 3000. In the same manner, the pedestal 114 may be negatively biased by a variable DC power source 3010 to bias the substrate 112 negatively to attract the ionized deposition material to the substrate 112. In an alternative embodiment, as shown in FIG. 4, the pedestal 114 may be biased by a high frequency RF power source to bias the substrate 112 so as to attract the ionized deposition material more uniformly to the substrate 112. One end of the pedestal 114 is coupled to an RF source such as the output of an amplifier and matching network 3025, the input of which is coupled to an RF generator 3045. The other end of the pedestal 114 is coupled to ground, preferably through a capacitor 3065, which may be a variable capacitor. Alternatively, as set forth in application Ser. No. 08/677,588, now abandoned entitled A METHOD FOR PROVIDING FULL-FACE HIGH DENSITY PLASMA PHYSICAL VAPOR DEPOSITION, filed Jul. 9, 1996 and assigned to the assignee of the present application, which application is incorporated herein by reference in its entirety, an external biasing of the substrate 112 may be omitted.

One end of the coil 104 is coupled to an RF source such as the output of an amplifier and matching network 3020, the input of which is coupled to an RF generator 3040. The other end of the coil 104 is coupled to ground, preferably through a capacitor 3060, which may be a variable capacitor. Similarly, one end of the electromagnet coil 1000 may be coupled to a DC power source such as the output of a transformer and rectifying circuit 4020, the input of which is coupled to an AC power generator 4040. The other end of the electromagnet coil 1000 is coupled to ground, preferably through a resistor 4060, which may also be a variable resistor. Likewise, one end of the electromagnet coil 1010 may be coupled to an DC power source such as the output of a transformer and rectifying circuit 5020, the input of which is coupled to an AC power generator 5040. The other end of the electromagnet coil 1010 is coupled to ground, preferably through a resistor 5060, which may also be a variable resistor. Alternatively, both electromagnet coils 1000 and 1010 may be identical, or both may be coupled to a common DC power generator, of course, or one or more AC power sources may be used. One or more of the electromagnet coils such as 1000 and 1010 may be superconducting, using windings of high-temperature or low-temperature superconducting materials, cryogenically cooled as needed, and able to be disconnected from any power supply once energized.

Figure 5:
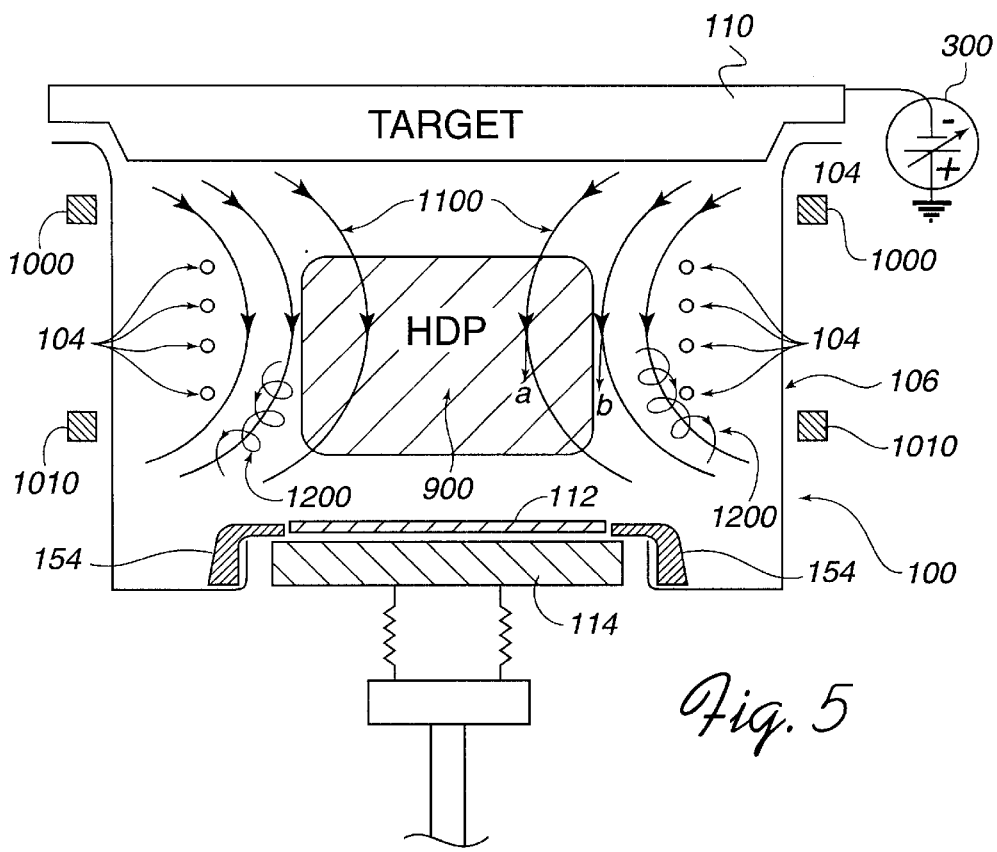
FIG. 5 is a schematic cross-sectional view of a plasma generating chamber in accordance with the embodiments of FIGS. 1–4.

FIG. 5 schematically represents the operation of the electromagnet coils 1000 and 1010 to reduce the sputtering of material from the coil 104, and to reduce the generation of particulate matter by the coil 104, and hence reduce contamination of the substrate 112. As shown in FIG. 5, magnetic field lines 1100 are generated by the electromagnet coils 1000 and 1010, causing the energized electrons from the high density plasma 900 to spiral in helical paths 1200 around the magnetic field lines 1100, deflecting the energized electrons from impacting the helical coil 104. The deflection of the energized electrons by the magnetic field lines 1100 also creates an electric field along the general direction of motion of the deflected electrons, deflecting energized ions of the high density plasma 900 and target material ions from impacting the helical coil 104. Furthermore, the magnetic field lines 1100 are believed to squeeze the high density plasma 900 inward toward the central axis of the plasma chamber 100, creating a buffer region from a few mm up to a cm or more, depending on the strength of the magnetic field lines 1100, radially inward from the coil 104, advantageously avoiding direct plasma heating of the coil 104. More specifically, the magnetic field lines 1100 deflect the energized electrons of the high density plasma 900 away from the coil 104 to a path around the coil 104 to the grounded chamber shield 106. This inhibits the energized electrons from lingering in the immediate vicinity of the coil 104 and ionizing precursor gas atoms and molecules that could sputter material from the coil 104, which could in turn contaminate the substrate 112. Still further, the magnetic field lines 1100 can magnetically shield the coil 104 to a limited extent from ionized deposition material which was originally ejected from the target 110. As a consequence, the accumulation of target material on the coil 104 can be reduced, thereby reducing the formation of particulates that could subsequently dislodge from the coil 104 and fall upon and contaminate the substrate 112. Typical magnetic field strengths generated by the electromagnet coils 1000 and 1010 in the region adjacent the RF coil 104 are in the range of 50–110 Gauss. Typical electron densities in the high density plasma 900 are on the order of $10^{12}$ cm$^{-3}$.

Figure 6:
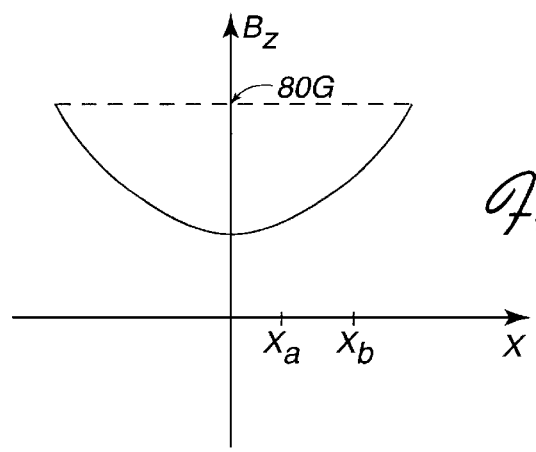
FIG. 6 is a graph schematically depicting the magnitude of the axial magnetic field strength of the magnetic shield of FIG. 5.

FIG. 6 schematically illustrates a preferred non-uniform arrangement for the magnitude of the magnetic field strength $B_z$ in the axial direction, plotted against the distance x from the central symmetry axis of the plasma chamber 100. For example, as shown in FIG. 6, the magnitude of the magnetic field strength a (FIG. 5) in the axial direction at the position $x_a$ closer to the central symmetry axis of the plasma chamber 100 is less than the magnitude of the magnetic field strength b (FIG. 5) in the axial direction at the position $x_b$ more distant from the central symmetry axis of the plasma chamber 100. Consequently, the influence of the magnetic field lines 1100 on the central region of the high density plasma 900 may be diminished in such a preferred non-uniform arrangement for the magnitude of the magnetic field strength $B_z$ in the axial direction, whereas the effective magnetic shielding on the periphery of the high density plasma 900 may be enhanced. Typical values for the magnitude of the magnetic field strength $B_z$ in the axial direction, at large distances x from the central symmetry axis of the plasma chamber 100, are on the order of 80 Gauss, as shown in FIG. 6. Typically, in preferred embodiments, it is believed that the magnitude of the magnetic field strength B generally falls off exponentially inward from the edge toward the central region of the high density plasma 900, given the relatively large conductivity of the high density plasma 900.

FIG. 2 shows the plasma chamber 100 installed in the vacuum chamber 102 of a physical vapor deposition (PVD) system. Although the plasma generator of the present invention is described in connection with a PVD system for illustration purposes, it should be appreciated that a plasma generator in accordance with the present invention is suitable for use with other semiconductor fabrication processes utilizing a plasma, including plasma etch, chemical vapor deposition (CVD) and various surface treatment processes.

The coil 104 is carried on the chamber shield 106 by a plurality of coil standoffs 120 (FIG. 1) which electrically insulate the coil 104 from the supporting chamber shield 106. In addition, the insulating coil standoffs 120 have an internal labyrinth structure which permits repeated deposition of conductive materials from the target 110 onto the coil standoffs 120 while preventing the formation of a complete conducting path of deposited material from the coil 104 to the chamber shield 106 which could short the coil 104 to the chamber shield 106 (which is typically grounded).

RF power is applied to the coil 104 by feedthrough bolts 356 (FIG. 2) which are supported by insulating feedthrough standoffs 124. As set forth in application Ser. No. 08/647,182, now abandoned entitled RECESSED COIL FOR GENERATING A PLASMA, filed May 9, 1996 and assigned to the assignee of the present application, which application is incorporated herein by reference in its entirety, the feedthrough standoffs 124, like the coil support standoffs 120, permit repeated deposition of conductive material from the target onto the feedthrough standoff 124 without the formation of a conducting path which could short the coil 104 to the chamber shield 106. As shown in FIG. 2, the coil feedthrough standoff 124, like the coil support standoff 120, has a generally disk-shaped insulative base member 350 and a generally cylindrical cover member 352 of bead blasted titanium which covers the insulative base member 350. The base member 350 and cover member 352 form an internal labyrinth structure somewhat similar to that of the coil standoff 120 to prevent the formation of a short between the coil 104 and the wall 140 of the shield. The feedthrough standoff 124 has a central aperture through which extends the threaded conductive feedthrough bolt 356 through which RF power is applied to the coil 104. The feedthrough bolt 356 is received by a titanium sleeve 358 which has a termination sleeve 359 of bead blasted titanium which receives the coil 104. The feedthrough standoff 124 is secured to the wall 140 of the shield by the insulative base member 350 on the interior side of the wall 140 and a nut 366 threaded onto the feedthrough bolt 356 on the other side of the wall 140. The nut 366 is spaced from the wall 140 by an electrical connector 368 and an insulative spacer 374. The electrical connector 368 connects the feedthrough 356 to an RF generator 3040 (shown schematically in FIG. 3) through a matching network 3020 (also shown schematically in FIG. 3).

Electromagnet coils 1000 and 1010 are positioned externally of the chamber shield 106, supported by electromagnet coil supports 1005 and 1015, respectively, as shown in FIG. 2. Electromagnet coil support 1005 may be attached to adapter ring assembly 152, and electromagnet coil support 1015 may be attached to vacuum chamber wall 108. The electromagnet coil 1000 connects, through an adapter ring assembly feedthrough (not shown), to a DC power source, as shown in FIG. 3. The electromagnet coil 1010 also connects, through a vacuum chamberwall feedthrough (not shown), to a DC power source, as shown in FIG. 3. Alternatively, one or both of the electromagnet coils 1000 and 1010 may be connected to an AC power source, which may cause the high density plasma 900 to rotate, which can lead to enhanced uniformity of deposition of material from the target 110 onto the substrate 112.

As best seen in FIG. 2, the plasma chamber 100 of this embodiment has a dark space shield ring 130 which provides a ground plane with respect to the target 110 above, which is negatively biased. In addition, as explained in greater detail in the aforementioned application Ser. No. 08/647,182, the shield ring 130 shields the outer edges of the target from the plasma to reduce sputtering of the target outer edges. The dark space shield 130 performs yet another function in that it is positioned to shield the coil 104 (and the coil support standoffs 120 and feedthrough standoffs 124) from the material being sputtered from the target 110.

In this illustrated embodiment, the dark space shield 130 is a closed continuous ring of (diamagnetic) titanium or (non-ferromagnetic) stainless steel or (non-magnetic nickel) having a generally inverted frusto-conical shape. The dark space shield extends inward toward the center of plasma chamber 100 so as to overlap the coil 104 by a distance d of ¼ inch. It is recognized, of course, that the amount of overlap can be varied depending upon the relative size and placement of the coil 104 and other factors. For example, the overlap may be increased to increase the shielding of the coil 104 from the sputtered material, but increasing the overlap could also further shield the target 110 from the plasma which may be undesirable in some applications. Alternatively, the amount of overlap between the dark space shield 130 and the coil 104 may be decreased by moving the coil 104 closer in toward the center of plasma chamber 100 so as to increase the energization of the high density plasma 900. Although such a decrease in overlap may reduce the shielding, by the dark space shield 130, of the coil 104 from the material sputtered from the target 110, the magnetic shielding by the magnetic field lines generated by the electromagnet coils 1000 and 1010 may fully or partially compensate for the reduction in shielding by the dark space shield 130.

The chamber shield 106 is generally bowl-shaped and includes a generally cylindrically shaped, vertically oriented wall 140 to which the standoffs 120 and 124 are attached to insulatively support the coil 104. The shield further has a generally annular-shaped floor wall 142 which surrounds the chuck or pedestal 114 which supports the substrate 112 which has an 8" diameter in the illustrated embodiment. A clamp ring 154 clamps the wafer to the chuck 114 and covers the gap between the floor wall 142 of the chamber shield 106 and the chuck 114. Thus, it is apparent from FIG. 2 that the chamber shield 106 together with the clamp ring 154 protects the interior of the vacuum chamber 102 from the deposition materials being deposited on the substrate 112 in the plasma chamber 100. As described more fully in the aforementioned copending application, Ser. No. 08/677,588, entitled A METHOD FOR PROVIDING FULL-FACE HIGH DENSITY PLASMA PHYSICAL VAPOR DEPOSITION, filed Jul. 9, 1996, the clamp ring may be eliminated. The chamber shield 106 also is preferably formed of (diamagnetic) titanium or (non-ferromagnetic) stainless steel or (non-magnetic nickel), like the dark space shield 130.

The vacuum chamber wall 108 has an upper annular flange 150. The plasma chamber 100 is supported by an adapter ring assembly 152 which engages the vacuum chamber wall flange 150. The chamber shield 106 has a horizontally extending outer flange member 160 which is fastened by a plurality of fastener screws (not shown) to a horizontally extending flange member 162 of the adapter ring assembly 152. The chamber shield 106 is grounded to the system ground through the adapter ring assembly 152.

The dark space shield 130 also has an upper flange 170 which is fastened to the horizontal flange 162 of the adapter ring assembly 152. The dark space shield 130, like the chamber shield 106, is grounded through the adapter ring assembly 152.

The target 110 is generally disk-shaped and is also supported by the adapter ring assembly 152. However, the target 110 is negatively biased and therefore should be insulated from the adapter ring assembly 152 which is grounded. Accordingly, seated in a channel 176 formed in the underside of the target 110 is a ceramic insulation ring assembly 172 which is also seated in a corresponding channel 174 in the upper side of the adapter ring assembly 152. The insulation ring assembly 172, which may be made of a variety of insulative materials including ceramics, spaces the target 110 from the adapter ring assembly 152 so that the target 110 may be adequately negatively biased. The target, adapter and ceramic ring assemblies are provided with O-ring sealing surfaces 178 to provide a vacuum tight assembly from the vacuum chamber flange 150 to the target 110.

The coil 104 of the illustrated embodiment is made of 2 inch by 1/8 inch heavy duty bead blasted solid high-purity (preferably 99.995% pure) titanium or copper ribbon formed into a three turn helical coil having a diameter of 12–14 inches. However, other highly conductive materials and shapes may be utilized depending upon the material being sputtered and other factors. For example, the ribbon may be as thin as 1/16 inch. Also, if the material to be sputtered is aluminum, both the target and the coil should be made of high purity aluminum. In addition to the ribbon shape illustrated, hollow tubing may be utilized, particularly if water cooling is desired.

The embodiment of FIGS. 1–5 shows only two electromagnet coils 1000 and 1010 being used, but, of course as few as one electromagnet coil could be used, and as many as ten or more electromagnet coils could also be used, or a combination of electromagnet coils and permanent magnets could be used as well. An advantage of using more electromagnet coils is that more electromagnet coils enable more precise shaping or "bottling" of the high density plasma 900, which can increase the effective electron density of the high density plasma 900 and lead to enhanced uniformity of deposition of material from the target 110 onto the substrate 112, and greater magnetic collimation of the material deposited from the target 110 onto the fine features and structures of the substrate 112, particularly those with very high aspect ratios, such as deep, narrow trenches, vias and contact holes.

Figure 7:
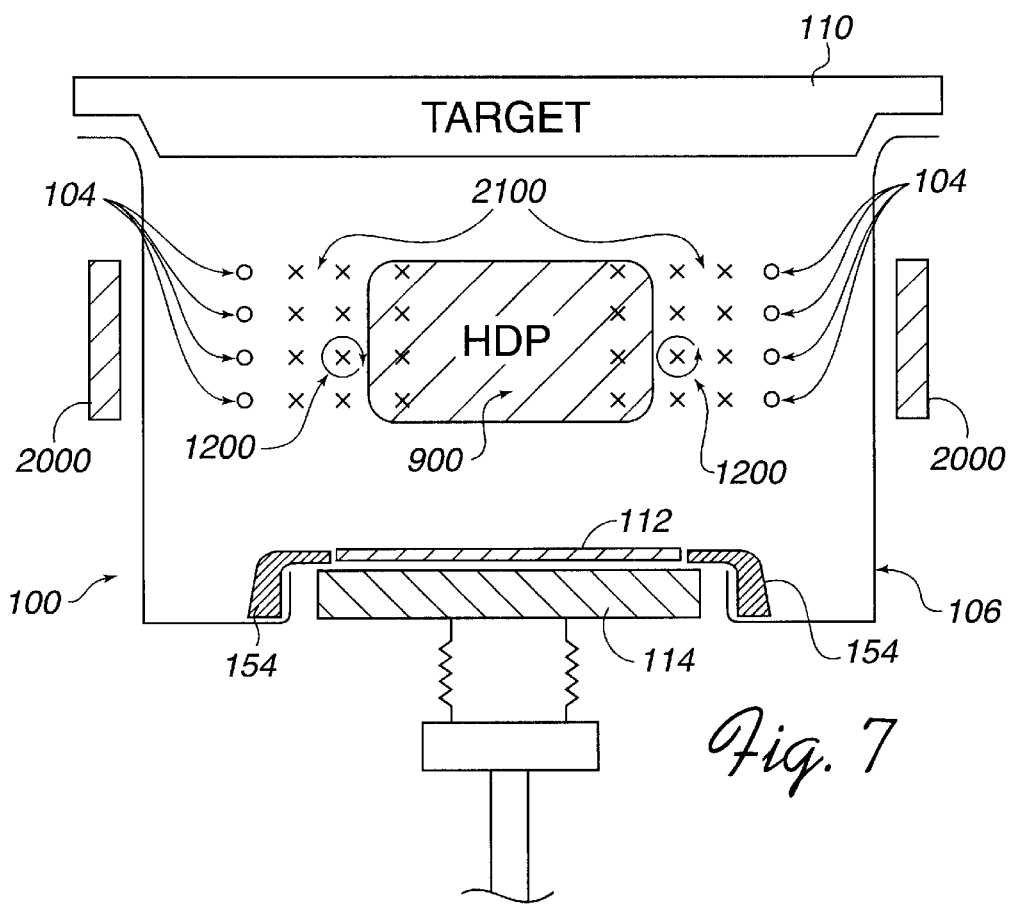
FIG. 7 is a cross-sectional view of a plasma generating chamber in accordance with yet another embodiment of the present invention.

FIG. 7 shows a cross-sectional view of a magnetically shielded helical coil 104 in accordance with another embodiment of the present invention in which the generation of particulate matter by the coil 104 is reduced by a somewhat different structure to reduce contamination of the substrate 112. In the embodiment of FIG. 7, magnetic field lines 2100 are generated by permanent magnets 2000, again causing the energized electrons in the high density plasma 900 to spiral in helical paths 1200 around the magnetic field lines 2100, deflecting the energized electrons and ions of the high density plasma 900, and the target material ions, from impacting the helical coil 104. The helical paths 1200 appear substantially circular when projected onto a plane substantially perpendicular to the magnetic field lines 2100, as shown in FIG. 7. The projections of the helical paths 1200 shown in FIG. 7 are appropriate for electrons since the magnetic field lines 2100 are going into the plane of the figure on the left side of FIG. 7 and are coming out of the plane of the figure on the right side of FIG. 7. The magnetic component of the Lorentz force in the ith direction $F_{im}$ on an electron moving with velocity $v_j$ in the jth direction in a magnetic field $B_k$ in the kth direction (the directions 1, 2 and 3 forming a right-handed coordinate system) is given by $$F_{im.} = -\frac{e}{c}\sum_{j=1}^{3}\sum_{k=1}^{3}\epsilon_{ijk}v_jB_k$$

where the absolute value of the electric charge e of an electron is $1.6021892\pm0.0000046\times10^{-19}$ Coulombs, the speed of light c is $2.99792458\pm0.000000012\times10^{10}$ cm/sec, and $\epsilon_{ijk}$ is the completely antisymmetric tensor ($\epsilon_{123}=1=\epsilon_{231}=\epsilon_{312}=-\epsilon_{213}=-\epsilon_{132}=-\epsilon_{321}$, all other components vanishing identically). For example, in FIG. 7, with the 1 direction horizontal, the 2 direction vertical and the 3 direction normal to the plane of the figure, on the left side of FIG. 7, when the magnetic field line 2100 is into the plane of the figure in the negative 3 direction ($B_1=0$, $B_2=0$, $B_3=-B$) and the electron's velocity in the plane of the figure is upward in the positive 2 direction ($v_1=0$, $v_2=v$, $v_3=0$), the magnetic component of the Lorentz force is to the right in the positive 1 direction ($F_{1m}=-\epsilon_{123}ev_2B_3/c=evB/c$, $F_{2m}=0$, $F_{3m}=0$); when the electron's velocity in the plane of the figure is to the right in the positive 1 direction ($v_1=v$, $v_2=0$, $v_3=0$), the magnetic component of the Lorentz force is downward in the negative 2 direction ($F_{1m}=0$, $F_{2m}=-\epsilon_{213}ev_1B_3/c=-evB/c$, $F_{3m}=0$); when the electron's velocity in the plane of the figure is downward in the negative 2 direction ($v_1=0$, $v_2=-v$, $v_3=0$), the magnetic component of the Lorentz force is to the left in the negative 1 direction ($F_{1m}=-\epsilon_{123}ev_2B_3/c=-evB/c$, $F_{2m}=0$, $F_{3m}32\ 0$); and when the electron's velocity in the plane of the figure is to the left in the negative 1 direction ($v_1=-v$, $v_2=0$, $v_3=0$), the magnetic component of the Lorentz force is upward in the positive 2 direction ($F_{1m}=0$, $F_{2m}=-\epsilon_{213}ev_1B_3/c=evB/c$, $F_{3m}=0$), resulting in a clockwise rotation of the electron in the plane of the figure, as shown on the left side of FIG. 6. Similarly, on the right side of FIG. 7, when the magnetic field line 2100 is out of the plane of the figure in the positive 3 direction ($B_1=0$, $B_2=0$, $B_3=B$) and the electron's velocity in the plane of the figure is upward in the positive 2 direction ($v_1=0$, $v_2=v$, $v_3=0$), the magnetic component of the Lorentz force is to the left in the negative 1 direction ($F_{1m}=-\epsilon_{123}ev_2B_3/c=-evB/c$, $F_{2m}=0$, $F_{3m}=0$); when the electron's, velocity in the plane of the figure is to the left in the negative 1 direction ($v_1=-v$, $v_2=0$, $v_3=0$), the magnetic component of the Lorentz force is downward in the negative 2 direction ($F_{1m}=0$, $F_{2m}=-\epsilon_{213}ev_1B_3/c=-evB/c$, $F_{3m}=0$); when the electron's velocity in the plane of the figure is downward in the negative 2 direction ($v_1=0$, $v_2=-v$, $v_3=0$), the magnetic component of the Lorentz force is to the right in the positive 1 direction ($F_{1m}=-\epsilon_{123}ev_2B_3/c=evB/c$, $F_{2m}=0$, $F_{3m}=0$); and when the electron's velocity in the plane of the figure is to the right in the positive 1 direction ($v_1=v$, $v_2=0$, $v_3=0$), the magnetic component of the Lorentz force is upward in the positive 2 direction ($F_{1m}=0$, $F_{2m}=-\epsilon_{213}ev_1B_3/c=evB/c$, $F_{3m}=0$), resulting in a counterclockwise rotation of the electron in the plane of the figure, as shown on the right side of FIG. 6.

The magnetic shielding provided by the magnetic field lines 2100 generated by the permanent magnets 2000 performs a similar function to that of the dark space shield 130 of the embodiment of FIGS. 1–5. More specifically, the magnetic field lines 2100 magnetically shield the coil 104 to a limited extent from deposition material being ejected from the target 110. Still further, as mentioned above, the magnetic field lines 2100 deflect the energized electrons from the high density plasma 900 away from the coil 104 and around the coil 104 to the grounded chamber shield 106. This prevents the energized electrons from lingering in the immediate vicinity of the coil 104 and ionizing precursor gas atoms and molecules that could sputter material from the coil 104 that could subsequently contaminate the substrate 112.

Figure 8:
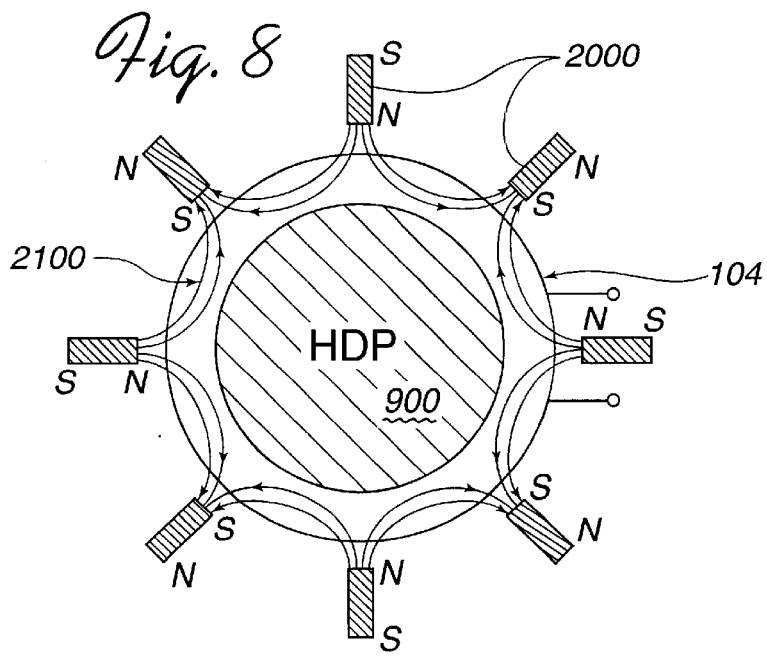
FIG. 8 is a schematic, plan view from above of components of the plasma generating chamber in accordance with the embodiment of FIG. 7.

FIG. 8 schematically shows a top plan view of a preferred alternating arrangement for the permanent magnets 2000 of the embodiment of FIG. 7. In addition, the permanent magnets 2000 may be mechanically rotated with respect to the coil 104 about the central axis of symmetry of the plasma chamber 100 to provide more uniform magnetic shielding of the coil 104 from energized electrons and ions of the high density plasma 900 and target material ions.

In each of the embodiments discussed above, multiple turn coils 104 and 204 were used, but, of course, single turn coils may be used instead. Still further, instead of the ribbon shape coils 104 and 204 illustrated, each turn of the coil 104 or 204 may be implemented with a flat, open-ended annular ring as described in application Ser. No. 08/680,335, now abandoned entitled COILS FOR GENERATING A PLASMA AND FOR SPUTTERING, filed Jul. 10, 1996 and assigned to the assignee of the present application, which application is incorporated herein by reference in its entirety.

Each of the embodiments discussed above utilized a single coil in the plasma chamber. It should be recognized that the present invention is applicable to plasma chambers having more than one RF powered coil. For example, the present invention may be applied to multiple coil chambers for launching helicon waves of the type described in aforementioned copending application Ser. No. 08/559,345, filed Nov. 15, 1995 and entitled METHOD AND APPARATUS FOR LAUNCHING A HELICON WAVE IN A PLASMA.

The appropriate RF generators and matching circuits are components well known to those skilled in the art. For example, an RF generator such as the ENI Genesis series which has the capability to "frequency hunt" for the best frequency match with the matching circuit and antenna is suitable. The frequency of the generator for generating the RF power to the coil 104 is preferably 2 MHz but it is anticipated that the range can vary from, for example, 1 MHz to 4 MHz. An RF power setting of 4.5 kW is preferred but a range of 1.5–5 kW is satisfactory. In addition, a DC power setting for biasing the target 110 of 3 kW is preferred but a range of 2–10 kW and a pedestal 114 bias voltage of −30 volts DC is satisfactory.

In the illustrated embodiments above, the chamber shield 106 has a diameter of 16", but it is anticipated that satisfactory results can be obtained with a diameter in the range of 6"–25". The shields may be fabricated from a variety of materials including insulative materials such as ceramics or quartz. However, the shield and all metal surfaces likely to be coated with the target material are preferably made of a material such as stainless steel or copper, unless made of the same material as the sputtered target material. The material of the structure which will be coated should have a coefficient of thermal expansion which closely matches that of the material being sputtered to reduce flaking of sputtered material from the shield or other structure onto the wafer. In addition, the material to be coated should have good adhesion to the sputtered material. Thus for example if the deposited material is titanium, the preferred metal of the shields, brackets and other structures likely to be coated is bead blasted titanium. Any surfaces which are more likely to sputter, such as the end caps of the coil and feedthrough standoffs, would preferably be made of the same type of material as the target, such as high purity titanium, for example. Of course, if the material to be deposited is a material other than titanium, the preferred metal is the deposited material, stainless steel, for example. Adherence can also be improved by coating the structures with molybdenum prior to sputtering the target. However, it is preferred that the coil (or any other surface likely to sputter) not be coated with molybdenum or other materials since the molybdenum can contaminate the workpiece if sputtered from the coil.

The wafer to target space is preferably about 140 mm (about 5.5"), but can range from about 1.5" to 8". For this wafer to target spacing, satisfactory stepped wafer bottom coverage has been achieved with a coil diameter of 11.4 inches spaced from the target by a distance of 1.9 inches. It has been found that increasing the diameter of the coil which moves the coil away from the workpiece edge has an adverse effect on bottom coverage. On the other hand, decreasing the coil diameter to move the coil closer to the wafer edge can adversely effect layer uniformity.

Deposition uniformity also appears to be a function of coil spacing from the target. As previously mentioned, a spacing of 1.9 inches between the coil and target has been found satisfactory for a target to wafer spacing of 140 mm. Moving the coil vertically either toward or away from the target (or wafer) can adversely effect deposition layer uniformity.

A variety of precursor gases may be utilized to generate the plasma including Ar, $H_2$, $O_2$ or reactive gases such as $NF_3$, $CF_4$ and many others. Various precursor gas pressures are suitable including pressures of 0.1–50 mTorr. For ionized PVD, a pressure between 10 and 100 mTorr is preferred for best ionization of sputtered material.

It will, of course, be understood that modifications of the present invention, in its various aspects, will be apparent to those skilled in the art, some being apparent only after study, others being matters of routine mechanical and electronic design. Other embodiments are also possible, their specific designs depending upon the particular application. As such, the scope of the invention should not be limited by the particular embodiments herein described but should be defined only by the appended claims and equivalents thereof.

What is claimed is:

1. An apparatus for energizing a plasma within a semiconductor fabrication system to deposit material onto a workpiece, the apparatus comprising:

a semiconductor fabrication chamber having a plasma generation area within said chamber;

a coil carried internally by said chamber and positioned to couple energy into said plasma generation area to ionize said deposition material;

a source of sputtered deposition material positioned to provide a stream of sputtered deposition material through said coil into said plasma generation area; and an arrangement of magnetic fields originating externally of said coil and positioned to reduce sputtering from said coil onto said workpiece.

2. The apparatus of claim 1 wherein said source comprises a sputtering target including titanium, and wherein said coil includes titanium.

3. The apparatus of claim 1 wherein said source comprises a sputtering target including aluminum, and wherein said coil includes aluminum.

4. The apparatus of claim 1 including a plurality of electromagnet coils carried by said chamber and positioned to provide said arrangement of magnetic fields.

5. The apparatus of claim 1 including a plurality of permanent magnets carried by said chamber and positioned to provide said arrangement of magnetic fields.

6. The apparatus of claim 4 wherein each of said electromagnet coils produces a magnetic field in said deposition stream.

7. The apparatus of claim 4 wherein each of said electromagnet coils encircles said plasma generation area.

8. An apparatus for energizing a plasma within a semiconductor fabrication system to ionize sputtered deposition material to be deposited onto a workpiece, the apparatus comprising:
   a semiconductor fabrication chamber having a plasma generation area within said chamber;
   an RF coil carried internally by said chamber and positioned to couple energy into said plasma generation area to ionize said deposition material;
   a sputtering target carried within said chamber and made of a first material, said target being positioned to sputter said target material through said coil and onto said workpiece; and
   first and second electromagnet coils external to said RF coil and carried by said chamber and positioned to provide magnetic fields positioned to reduce sputtering from said coil onto said workpiece.

9. The apparatus of claim 8 wherein said first and second electromagnet coils are positioned so that a magnitude of a magnetic field strength is substantially at a minimum substantially at a central region of said chamber.

10. The apparatus of claim 8 including:
    a first source for applying a DC bias to said target;
    a second source for applying a DC bias to said workpiece; and
    an RF generator for applying RF power to said coil; and
    a third source for applying DC power to said first and second electromagnet coils.

11. The apparatus of claim 8 including:
    a first source for applying a DC bias to said target;
    a second source for applying a DC bias to said workpiece; and
    an RF generator for applying RF power to said coil;
    a third source for applying DC power to said first electromagnet coil; and
    a fourth source for applying DC power to said second electromagnet coil.

12. The apparatus of claim 8 including:
    a source for applying a DC bias to said target;
    an RF source for applying an alternating bias to said workpiece; and
    an RF generator for applying RF power to said coil; and
    a source for applying DC power to said first and second electromagnet coils.

13. The apparatus of claim 8 including:
    a source for applying a DC bias to said target;
    an RF source for applying an alternating bias to said workpiece; and
    an RF generator for applying RF power to said coil;
    a first source for applying DC power to said first electromagnet coil; and
    a second source for applying DC power to said second electromagnet coil.

14. The apparatus of claim 8 wherein each of said electromagnet coils produces a magnetic field in said deposition stream.

15. The apparatus of claim 8 wherein each of said electromagnet coils encircles said plasma generation area.

16. An apparatus for energizing a plasma within a semiconductor fabrication system to deposit ionized sputtered material onto a workpiece, the apparatus comprising:
    a semiconductor fabrication chamber having a plasma generation area within said chamber;
    a target carried by said chamber and positioned to provide a stream of deposition material through said plasma generation area to deposit sputtered material onto said workpiece;
    a coil carried internally by said chamber between said target and said workpiece and positioned to couple energy into said plasma generation area to ionize sputtered material in said stream of deposition material; and
    an arrangement of magnetic fields originating external to said coil and positioned to reduce deposition of sputtered material from said target onto said coil.

17. A method of depositing material on a workpiece, the method comprising
    sputtering target material through a coil and onto said workpiece from a target positioned adjacent said coil in a chamber; and
    generating magnetic fields externally of said coil to magnetically shield said coil positioned adjacent said workpiece to reduce sputtering of coil material onto said workpiece from said coil.

18. The method of claim 17 wherein said generating includes energizing a plurality of electromagnet coils to provide said magnetic shielding of said coil.

19. The method of claim 17 wherein said target and said coil include the same type of material.

20. The method of claim 17 wherein said generating includes positioning a plurality of permanent magnets external to said coil to provide said magnetic shielding of said coil.

21. A method of depositing material on a workpiece, the method comprising
    sputtering target material through a coil and onto said workpiece from a target positioned adjacent said coil in a chamber; and
    generating magnetic fields externally of said coil to magnetically shield said coil positioned adjacent said workpiece to reduce sputtering of target material onto said coil from said target.

* * * * *